US012719431B2

(12) United States Patent
Michelutti et al.

(10) Patent No.: US 12,719,431 B2
(45) Date of Patent: Aug. 25, 2026

(54) COIL SENSOR CIRCUIT AND METHOD FOR OPERATING A COIL SENSOR CIRCUIT

(71) Applicant: Infineon Technologies AG, Neubiberg (DE)

(72) Inventors: Alessandro Michelutti, Villach (AT); Diego Lunardini, Finkenstein am Faaker See (AT); Edwin Mario Motz, Wernberg (AT); Francesco Polo, Arnoldstein (AT)

(73) Assignee: Infineon Technologies AG, Neubiberg (DE)

( * ) Notice: Subject to any disclaimer, the term of this patent is extended or adjusted under 35 U.S.C. 154(b) by 123 days.

(21) Appl. No.: 18/894,255

(22) Filed: Sep. 24, 2024

(65) Prior Publication Data

US 2025/0141417 A1 May 1, 2025

(30) Foreign Application Priority Data

Oct. 26, 2023 (DE) ......................... 102023129494.6

(51) Int. Cl.
*H03F 3/45* (2006.01)
*G01R 15/18* (2006.01)
*H03H 7/06* (2006.01)

(52) U.S. Cl.
CPC ......... *H03F 3/45475* (2013.01); *G01R 15/18* (2013.01); *H03H 7/06* (2013.01); *H03F 2200/129* (2013.01)

(58) Field of Classification Search
CPC ........... H03F 3/45475; H03F 2200/129; G01R 15/18; H03H 7/06
See application file for complete search history.

(56) References Cited

U.S. PATENT DOCUMENTS

| | | | | |
|---|---|---|---|---|
| 5,233,312 | A * | 8/1993 | Duft | H03F 1/303 330/290 |
| 6,208,497 | B1 * | 3/2001 | Seale | H02K 41/03 361/160 |
| 11,828,625 | B2 | 11/2023 | Motz et al. | |
| 2023/0314176 | A1 * | 10/2023 | Motz | G01D 5/145 324/207.2 |
| 2024/0332777 | A1 * | 10/2024 | Hoshiko | H01P 5/18 |

FOREIGN PATENT DOCUMENTS

DE 102023108740 A1 10/2023

* cited by examiner

*Primary Examiner* — Paresh Patel
(74) *Attorney, Agent, or Firm* — Harrity & Harrity, LLP

(57) ABSTRACT

The present disclosure proposes a coil sensor circuit including a sensor coil configured to provide an AC sensor signal, a feedforward amplifier stage configured to amplify the AC sensor signal to obtain an amplified sensor signal, a feedback amplifier stage coupled between an output and an input of the feedforward amplifier stage and configured to provide a control signal for cancelling a DC offset of the feedforward amplifier stage, and a switching circuit The switching circuit is configured to, during a first operational mode of the coil sensor circuit, couple the sensor coil to the input of the feedforward amplifier stage, and, during a second operational mode of the coil sensor circuit, decouple the sensor coil from the feedforward amplifier stage, and increase a gain of the coil sensor circuit with respect to the first operational mode.

16 Claims, 3 Drawing Sheets

COIL SENSOR CIRCUIT AND METHOD FOR OPERATING A COIL SENSOR CIRCUIT

CROSS-REFERENCE TO RELATED APPLICATION

This application claims priority to Germany Patent Application No. 102023129494.6 filed on Oct. 26, 2023, the content of which is incorporated by reference herein in its entirety.

TECHNICAL FIELD

The present disclosure generally relates to apparatuses and methods for sensing magnetic fields and/or electrical currents and, more particularly, to inductive current sensors and sensing methods.

BACKGROUND

A coil sensor, also known as inductive sensor, is a type of sensor that operates based on the principle of electromagnetic induction. Coil sensors may be used to measure electrical current in an electrical circuit without directly connecting to the circuit itself. An inductive current sensor comprises a coil of wire which may be wound around a magnetic core. This coil may be placed in proximity to a conductor through which the current to be measured flows. When an alternating current (AC) flows through the conductor (the one being measured), it generates a magnetic field around the conductor. This magnetic field also passes through the coil of the inductive sensor. According to Faraday's law of electromagnetic induction, a change in magnetic flux through a coil induces a voltage in the coil. In the case of an inductive current sensor, the changing magnetic field resulting from the AC current in the primary conductor induces a voltage in the coil. The induced voltage in the coil of the current sensor is proportional to the current flowing through the primary conductor. By measuring this induced voltage, the sensor can accurately determine the current magnitude.

A coil sensor circuit may comprise a pick-up coil (sensor element), a preamplifier (feedforward) stage with amplification and anti-saturation function for high-frequencies (e.g., provided by a low pass-filter) and a DC servo loop for DC offset cancellation of the preamplifier stage. Operational amplifiers (op-amps), commonly used in amplifier circuits, may have input offset voltage characteristics. This means that there can be a small DC voltage difference between their inverting and non-inverting inputs. When this voltage is amplified, it can lead to DC offset at the amplifier's output.

A signal to offset ratio $V_{coil}/V_{offset,out}$ of a coil sensor may be linearly degrading by lowering an input signal frequency. In order to remove the DC offset components without limiting too much a minimal useful signal bandwidth of the input signal, and without employing very large capacitors in series to the signal, a DC servo-loop may be used, with a 0 dB open loop frequency as low as possible. In other words, in case the DC servo-loop had a 0 dB open loop frequency too high, the loop would start rejecting the useful signal.

In a DC servo loop, the term "0 dB open-loop frequency" typically refers to the frequency up to which the open-loop gain of the system is equal to 0 decibels (dB), which corresponds to a gain of 1 in linear terms (unity gain). The 0 dB open-loop frequency represents the point at which the system starts attenuating signals above this frequency.

As a desired application may be wide-band, also high frequencies inputs should be addressed to the system and a fast removal of the offset is necessary. This means that a slow settling of the DC servo-loop represents a problem as a user would be forced to wait for very long start-up time until the offset is completely removed. An alternative way to remove the DC offset could be the usage of chopping technique but due to wide-band application frequencies, this may not be feasible.

Hence, there is a demand for a quick DC offset removal for wide-band application coil sensor arrangements with a pick-up coil, a preamplifier stage, and a DC servo loop for offset cancellation of the preamplifier stage.

SUMMARY

This demand is addressed by apparatuses and methods in accordance with the appended claims.

According to a first aspect, the present disclosure proposes a (inductive) coil sensor circuit. The coil sensor circuit includes a sensor coil which is configured to provide an AC sensor signal (e.g., voltage) in response to a varying magnetic field. Downstream to the sensor coil, the coil sensor circuit includes a feedforward amplifier circuit configured to amplify the AC sensor signal and to obtain an amplified sensor signal. The coil sensor circuit further includes a feedback amplifier circuit coupled between an output and an input of the feedforward amplifier circuit. The feedback amplifier circuit is configured to provide a control signal for cancelling a DC offset of the feedforward amplifier circuit. The proposed coil sensor circuit also includes a switching circuit which is configured to, during a first operational mode of the coil sensor circuit, couple the sensor coil to the input of the feedforward amplifier stage, and, during a second operational mode of the coil sensor circuit, decouple the sensor coil from the feedforward amplifier stage, and increase the gain of the coil sensor circuit with respect to the first operational mode (e.g., increase the gain of the coil sensor circuit in the second operational mode relative to the gain of the coil sensor in the first operational mode). The first operational mode may also be referred to as normal operational mode. The second operational mode may also be referred to as startup or autocalibration mode. In the second operational mode, a useful signal from the coil may be discarded and only a DC offset may be processed by the servo loop including the feedforward and feedback amplifier circuits.

In some implementations, the switching circuit includes a plurality of switches, each switch having a parasitic resistance. The respective parasitic resistances may be (substantially) smaller than a resistance of the coil. A gain of the feedforward amplifier stage is essentially independent of the parasitic resistances in the first operational mode (normal operational mode). For example, a position/location of the switches is such that the parasitic resistances of the switches do not contribute to the gain of the feed-forward amplifier.

In some implementations, the switching circuit includes at least a first switch coupled between the sensor coil and an input of the feedforward amplifier stage, at least a second switch coupled between an output and the input of the feedforward amplifier stage, and at least a third switch coupled between a DC voltage source and the input of the feedforward amplifier stage. The switching circuit may be configured to, during the first operational mode, close the at least one first switch and open the at least one second and third switches, and, during the second operational mode, close the second and third switches and open the first switch.

In some implementations, the switching circuit is configured to increase the gain of the feedforward amplifier stage during the second operational mode (startup mode). For example, the switching circuit may be configured to change a resistance ratio between resistances at the input and in a feedback path of the feedforward amplifier stage.

In some implementations, the switching circuit is configured to increase the gain of the coil sensor circuit during the second operational mode (startup mode) by switching between a first and a second circuit configuration between the output and the input of the feed-forward amplifier stage. For example, the first circuit configuration may include the coil coupled to the input of the feedforward amplifier stage and a resistor-capacitor (RC) lowpass filter coupled between the input and the output of the feedforward amplifier stage. The second circuit configuration may include the coil decoupled from the input of the feedforward amplifier stage, and a (high ohmic) resistor coupled between the input and the output of the feedforward amplifier stage.

In some implementations, the switching circuit is configured to, during the first operational mode, couple a RC lowpass filter between the input and the output of the feedforward amplifier stage, and, during the second operational mode, replace the RC lowpass filter by a feedback resistor. For example, the RC lowpass filter may be operationally decoupled from the circuit (e.g., decoupled from the input of the feedforward amplifier stage) and the feedback resistor may be operationally coupled to the circuit (e.g., coupled to the input of the feedforward amplifier stage). Thus, "replace" may mean replace a connection, an operation, or a function of one component with another component by a respective switch. Put another way the coupling/decoupling of one component may be complementary to a coupling/decoupling of another component such that the two components replace one another. The switching circuit may be configured to, during the first operational mode, decouple the feedback resistor from the input of the feedforward amplifier stage, and, during the second operational mode, decouple the RC lowpass filter from the input of the feedforward amplifier stage.

In some implementations, the switching circuit is configured to, during the second operational mode, replace (e.g., operationally replace) the sensor coil by a DC voltage source at the input of the feedforward amplifier stage, and, during the first operational mode, replace the DC voltage source by the sensor coil at the input of the feedforward amplifier stage.

In some implementations, a DC voltage of the DC voltage source essentially corresponds to a common mode voltage of the sensor coil in the first operational mode.

In some implementations, the feedback amplifier stage is configured as an integrator. A capacitor may be coupled between an output and an input of the feedback amplifier stage.

In some implementations, one or more resistors may be coupled between an output of the feedback amplifier stage and the input of feedforward amplifier stage.

In some implementations, one or more resistors may be coupled between the output of the feedforward amplifier stage and an input of the feedback amplifier stage.

In some implementations, the feedforward amplifier stage and the feedback amplifier stage are configured as differential amplifier stages, respectively.

According to a further aspect, the present disclosure proposes method for operating a coil sensor circuit. The method includes, during a first operational mode of the coil sensor circuit:

- providing an AC sensor signal from a sensor coil to a feedforward amplifier stage of the coil sensor circuit to obtain an amplified sensor signal,
- providing the amplified sensor signal from an output of the feedforward amplifier stage to an input of a feedback amplifier stage of the coil sensor circuit to obtain control signal for cancelling a DC offset of the feedforward amplifier stage,
- providing the control signal from an output of the feedback amplifier stage to an input of the feedforward amplifier stage.

During a second operational mode of the coil sensor circuit, the method includes:

- decoupling the sensor coil from the input of the feedforward amplifier stage, and
- increasing a gain of the coil sensor circuit with respect to the first operational mode.

The gain may be increased by replacing the sensor coil at the input of the feedforward amplifier stage by a (common mode) DC voltage source. Further, a RC lowpass filter between the input and the output of the feedforward amplifier stage may be replaced (e.g., operationally replaced) by a feedback resistor.

According to a further aspect, the present disclosure proposes a (inductive) coil sensor circuit. The coil sensor circuit includes a sensor coil which is configured to provide an AC sensor signal (e.g., voltage) in response to a varying magnetic field. Downstream to the sensor coil, the coil sensor circuit includes a feedforward amplifier circuit configured to amplify the AC sensor signal and to obtain an amplified sensor signal. The coil sensor circuit further includes a feedback amplifier circuit coupled between an output and an input of the feedforward amplifier circuit. The feedback amplifier circuit is configured to provide a control signal for cancelling a DC offset of the feedforward amplifier circuit. The proposed coil sensor circuit also includes a switching circuit which is configured to, during a first operational mode of the coil sensor circuit, couple the sensor coil to the input of the feedforward amplifier stage, and, during a second operational mode of the coil sensor circuit, replace the sensor coil by a DC voltage source at the input of the feedforward amplifier stage. A DC voltage of the DC voltage source may correspond to a common mode voltage of the sensor coil in the first operational mode. Further, the switching circuit may be configured to, during the second operational mode, replace a RC lowpass filter between the input and the output of the feedforward amplifier stage may by a feedback resistor.

Implementations of the present disclosure may allow to separate an undesired amplified offset from a useful coil signal at startup (applying of supply or calibration mode). For fast settling of a system operation point, a multiplexing of the feedforward amplifier stage's input from a coil input signal to a common mode signal (=differential short-cut) and switching on low-impedance feedback circuits may be done during calibration phase. This separation may guarantee the offset cancellation in a fast way, during auto-calibration mode.

BRIEF DESCRIPTION OF THE DRAWINGS

Some examples of apparatuses and/or methods will be described in the following by way of example only, and with reference to the accompanying figures, in which.

DETAILED DESCRIPTION

Figure 1:
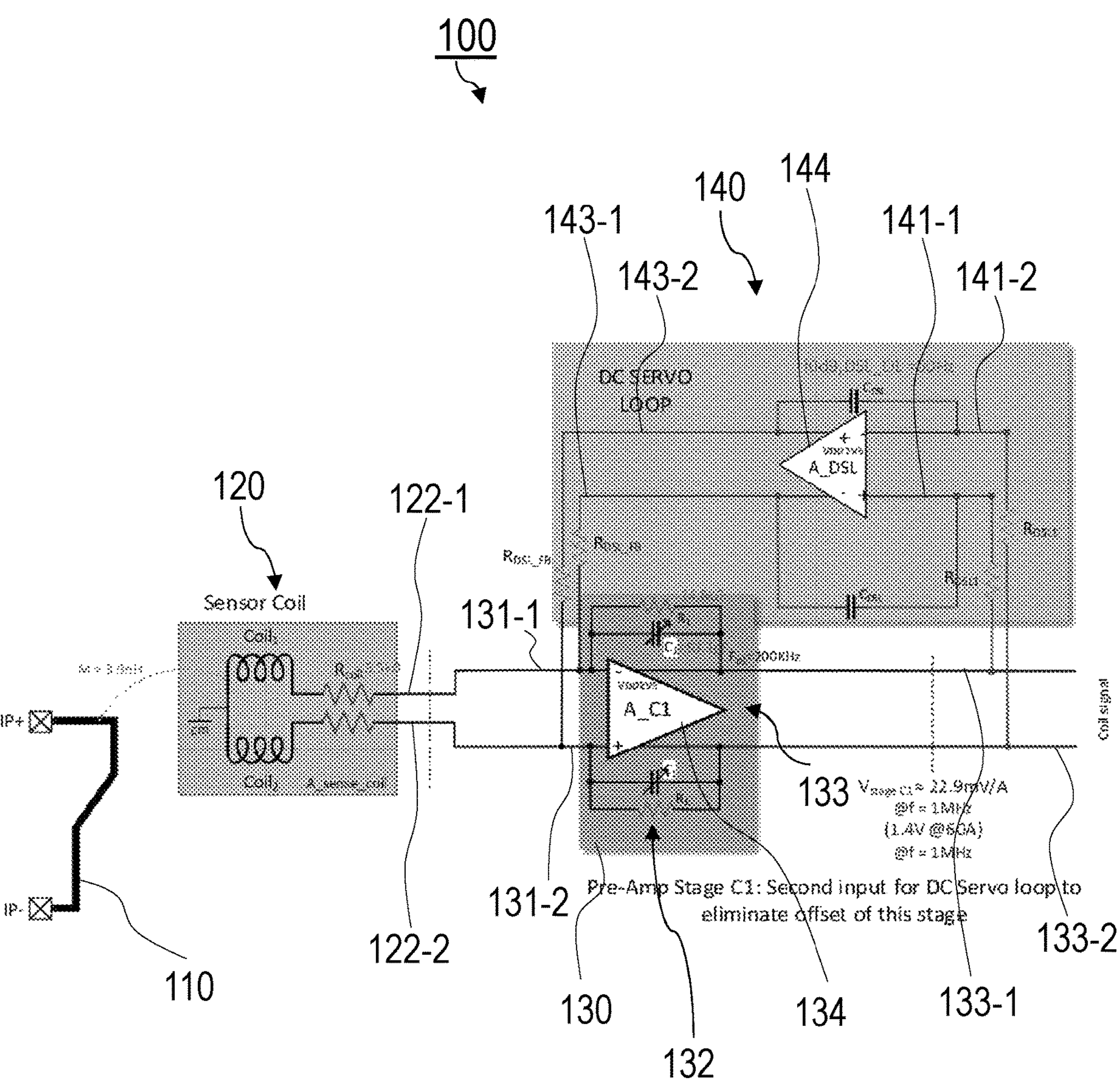
FIG. 1 shows a conventional inductive current sensor arrangement.

Some examples are now described in more detail with reference to the enclosed figures. However, other possible examples are not limited to the features of these implementations described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, e.g., only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1 shows an example of an inductive current sensor arrangement 100.

Inductive current sensor arrangement 100 comprises a primary conductor 110 through which an alternating current (AC) to be measured may flow. The primary conductor 110 may be a current rail, a conductor path of an IC, or another electrical conductor, such as a wire. The electrical current causes a changing magnetic field around the primary conductor 110.

Inductive current sensor arrangement 100 comprises one or more sensor coils 120 placed in proximity to primary conductor 110. The one or more coils 120 are not directly connected to the primary conductor 110 but are in sufficient proximity to it. One sensor coil may be sufficient for single-ended measurement concepts. One or two sensor coils may be used for differential measurement concepts. The skilled person having benefit from the present disclosure will appreciate that the proposed concepts described herein may be used for both single-ended as well as differential measurement concepts.

The sensor coil 120 illustrated in FIG. 1 comprises a first coil portion ($Coil_1$) and a second coil portion ($Coil_2$). The coil portions ($Coil_1$, $Coil_2$) each comprise a respective inductance $L_1$, $L_2$ as well as a respective resistance $R_1$, $R_2$. An overall resistance of coil 120 may be $R_1+R_2=R_{coil}=3.5$ kΩ. A first terminal 122-1 of coil 120 is coupled to an inverting input terminal 131-1 of a feedforward amplifier stage 130 of inductive current sensor arrangement 100. A second terminal 122-2 of coil 120 is coupled to a non-inverting input terminal 131-2 of feedforward amplifier stage 130. The changing magnetic field induced by the primary conductor 110 causes a voltage to be induced in the coil 120 through electromagnetic induction. The induced voltage in the coil 120 is proportional to the current flowing through the primary conductor 110. This induced voltage is then used as input signal of feedforward amplifier stage 130 downstream to the coils 120.

The feedforward amplifier stage 130 coupled to coil 120 has a transfer function with a pole at a frequency $f_p$ (e.g., $f_p$=200 kHz). A pole of the transfer function denotes a root of the transfer function's denominator polynomial. A pole frequency corresponds to a corner frequency at which the slope of the transfer function's magnitude curve decreases by 20 dB/decade. The pole of the transfer function at the frequency $f_p$ may limit an overload effect from the coil 120 caused by high frequency (AC) magnetic fields (currents). The feedforward amplifier stage 130 comprises an RC filter 132 coupled between input 131 and an output 133 of an operational amplifier 134. The RC filter 132 causes the pole at the frequency $f_p$ and may thus be considered as a lowpass filter.

The RC filter 132 in this differential circuit example comprises an inverting filter branch coupled between inverting input terminal 131-1 and output terminal 133-1 of the operational amplifier 134. The inverting filter branch comprises a resistor $R_1$ in parallel to an adjustable capacitor $C_1$. The RC filter 132 in this differential circuit example comprises a further non-inverting branch comprising a resistor $R_1$ in parallel to a capacitor $C_1$ coupled between non-inverting input 131-2 and output 133-2 of the operational amplifier 134. The skilled person having benefit from the present disclosure will appreciate that only one filter branch may be needed in case of a non-differential setup. The RC filter 132 comprising the resistor $R_1$ in parallel to capacitor $C_1$ causes the pole at the frequency $f_p$. A resistance of resistor $R_1$ may be 14.8 kΩ, for example. A capacitance of capacitor $C_1$ may be 53.1 pF, for example.

Inductive current sensor arrangement 100 further comprises a feedback amplifier stage 140 is coupled between output 133 and input 131 of the feedforward amplifier stage 130 and configured to provide a control signal for cancelling a DC offset of the feedforward amplifier stage 130. Feedforward amplifier stage 130 and feedback amplifier stage 140 between output 133 and input 131 of the feedforward amplifier stage 130 together form a so-called DC servo-loop.

Feedback amplifier stage 140 comprises an operational amplifier 144. A non-inverting input 141-1 of operational amplifier 144 is coupled to inverting output 133-1 of feedforward amplifier stage 130 via an optional resistor $R_{DSL1}$. An inverting input 141-2 of operational amplifier 144 is coupled to non-inverting output 133-2 of feedforward amplifier stage 130 via an optional resistor $R_{DSL1}$. The feedback amplifier stage 140 comprises a capacitor 142 coupled between input 141 and an output 143 of operational amplifier 144. The capacitor 142 in this differential circuit example comprises a second capacitor branch $C_{DSL}$ coupled between non-inverting input 141-1 and inverting output 143-1 of the operational amplifier 144. The skilled person having benefit from the present disclosure will appreciate that only one capacitor branch may be needed in case of a non-differential setup.

Feedback amplifier stage 140 further comprises one or more feedback resistors $R_{DSL\_FB}$ coupled between output 143 of operational amplifier 144 and input 131 of feedforward amplifier stage 130 (or operational amplifier 134). In the illustrated differential circuit example, feedback amplifier stage 140 a first feedback resistor $R_{DSL\_FB}$ coupled between non-inverting output 143-2 of operational amplifier 144 and non-inverting input 131-2 of feedforward amplifier stage 130 and a second feedback resistor $R_{DSL\_FB}$ coupled between inverting output 143-1 of operational amplifier 144 and inverting input 131-1 of feedforward amplifier stage 130.

Feedback amplifier stage 140 acts as an integrator. The DC offset (error signal) at output 133 of feedforward amplifier stage 130 is passed through the integrator 140, which continuously sums up the DC offset over time. AC components of the feedforward amplifier stage's 130 output signal cannot pass the feedback amplifier stage 140. This process accumulates the DC offset and generates an output signal that increases or decreases with time based on the cumulative error. The output of the feedback amplifier stage 140 is the control signal sent to the feedforward amplifier stage 130. The integrator's output acts as a corrective signal that can help eliminate steady-state errors.

In some implementations, sensor coil 120, the feedforward amplifier stage 130, and the feedback amplifier stage 140 may be integrated in a common integrated circuit (IC). The primary conductor 110 may be external to the IC.

A voltage coil signal at the feedforward amplifier output 133 for frequencies lower than the low-pass filter pole (e.g., $f<f_p$) is:

$$V_{coil} = 2\pi f * nA * B * \frac{R_1}{R_{coil}}$$

A DC offset of the feedforward amplifier stage 130 at its output 133 is amplified as follows:

$$V_{offset,out} = V_{offset,in} * \left(1 + \frac{R_1}{R_{coil}}\right) \tag{0}$$

The signal to offset ratio $V_{coil}/V_{offset,out}$ is linearly degrading by lowering the input signal frequency. In order to remove the DC offset components without limiting too much the minimal useful signal bandwidth of the input signal at input 131, and without employing very large capacitors in series to the signal, the DC servo-loop 130, 140 is used, with a 0 dB open loop frequency as low as possible.

If a desired application is wide-band, also high frequencies inputs should be addressed to the system and a fast removal of the DC offset is necessary. This means that the slow settling of the DC servo-loop represents a problem (a user would be forced to wait for very long start-up time until the DC offset is completely removed).

The present disclosure proposes an arrangement of circuits which may separate the undesired amplified DC offset from the useful coil signal at startup. For a fast settling of a system operation point, the present disclosure proposes to multiplex the input 131 of the feedforward amplifier stage 130 from coil input signal to a common mode signal (=differential shortcut) and switching on low-impedance feedback circuits during the startup/calibration phase. This separation may support the offset cancellation in a fast way, during auto-calibration mode.

Figure 2:
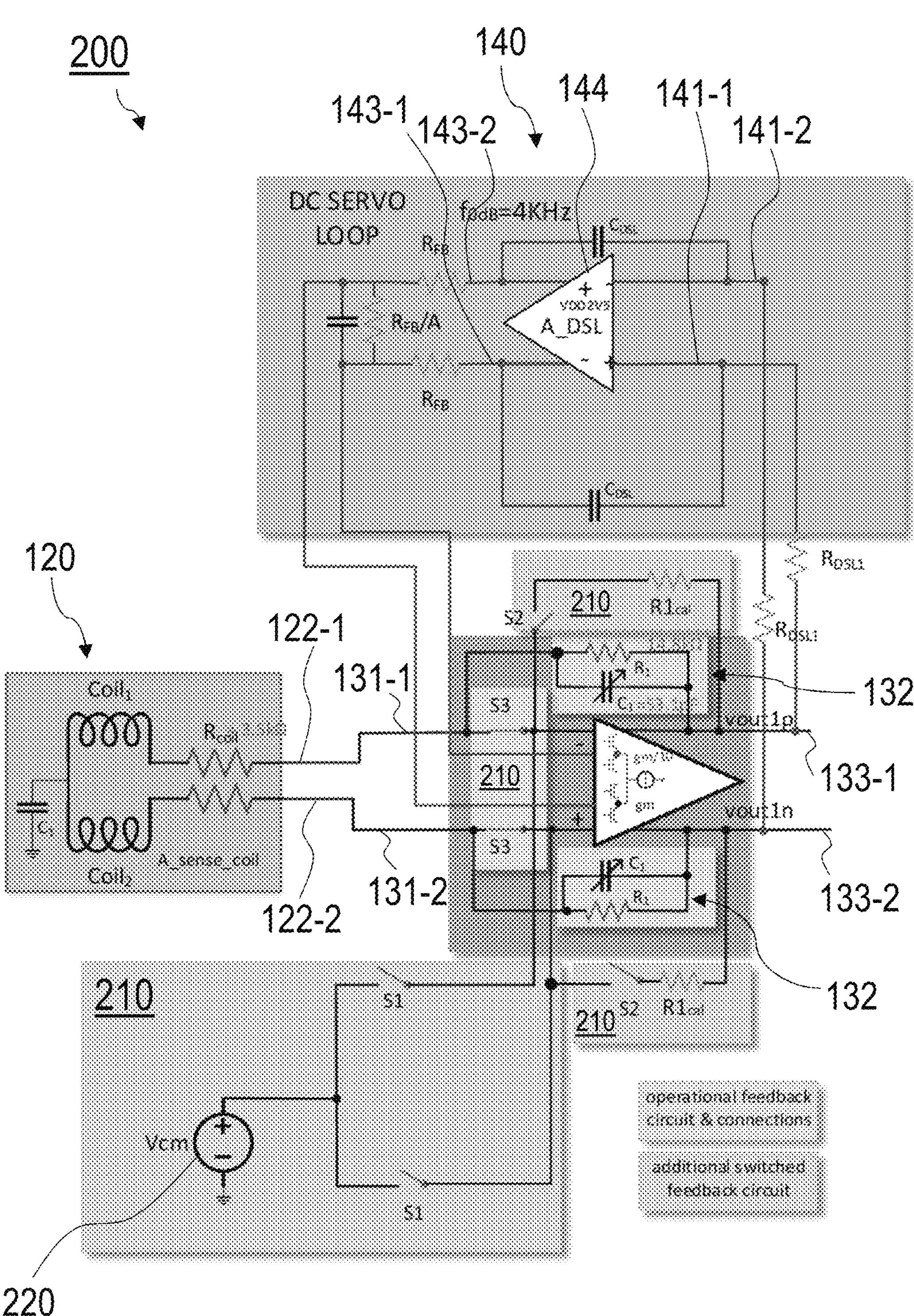
FIG. 2 shows a coil sensor arrangement in accordance with implementations of the present disclosure.

FIG. 2 shows an inductive current sensor arrangement 200 according to an implementation of the present disclosure.

In addition to the inductive current sensor arrangement 100 shown in FIG. 1, inductive current sensor arrangement 200 of FIG. 2 comprises a switching circuit 210 which is configured to switch between two operational modes of inductive current sensor arrangement 200. During a first operational mode (normal operation), the sensor coil 120 is coupled to the input 131 of the feedforward amplifier stage 130. During a second operational mode (startup/calibration mode), the sensor coil 120 is decoupled from the feedforward amplifier stage 130 and the gain of the amplifier circuit 130, 140 is increased with respect to the first operational mode.

In the illustrated example, switching circuit 210 comprises three (pairs of) switches S1, S2, and S3 which are located such that respective parasitic resistances of switches S1, S2, and S3 essentially do not contribute to the gain of the feedforward amplifier stage 130. In other words, the feedforward amplifier gain in the first operational mode does not depend on (is independent from) the respective parasitic resistances of the switches S1, S2, and S3.

Switch S1 is coupled between a DC voltage source 220 and the input 131 of the feedforward amplifier stage 130 and is configured to couple or decouple the DC voltage source 220 to or from the feedforward amplifier stage 130. A DC voltage of the DC voltage source 220 may essentially correspond to a common mode voltage $V_{cm}$ of the sensor coil 120 in the first operational mode. In the illustrated differential circuit example, a first switch S1 is coupled between the DC voltage source 220 and the inverting input 131-1 of feedforward amplifier stage 130 and a second switch S1 is coupled between the DC voltage source 220 and the non-inverting input 131-2 of feedforward amplifier stage 130. Each of the switches S1 has a low-ohmic parasitic resistance $R_{S1}$ ($R_{S1} \ll R_{coil}$).

Switch S2 is coupled between output 133 and input 131 of the feedforward amplifier stage 130 and is configured to increase the gain of the feedforward amplifier stage 130 during the second operational mode by switching between a first and a second circuit configuration between the output 133 and the input 131 of the feedforward amplifier stage 130. The feedforward amplifier stage 130 of the example implementation shown in FIG. 2 additionally comprises a feedback resistor $\mathbf{R1}_{cal}$ coupled between output 133 and input 131 of the feedforward amplifier stage 130. Switch S2 is coupled between feedback resistor $\mathbf{R1}_{cal}$ and input 131 of the feedforward amplifier stage 130. In the illustrated differential circuit example, a first switch S2 is coupled in the feedback branch between the inverting output 133-1 and the inverting input 131-1 of operational amplifier 134. The first switch S2 is coupled between feedback resistor $\mathbf{R1}_{cal}$ and the inverting input 131-1 of operational amplifier 134. In the illustrated differential circuit example, a second switch S2 is coupled in the feedback branch between the non-inverting output 133-2 and the non-inverting input 131-2 of operational amplifier 134. The second switch S2 is coupled between feedback resistor $\mathbf{R1}_{cal}$ and the non-inverting input 131-1 of operational amplifier 134. Each of the switches S2 has a low-ohmic parasitic resistance $R_{S2}$ ($R_{S2} \ll R_{coil}$ and $R_{S2} \ll R1_{cal}$).

Switch S3 is coupled between the sensor coil 120 and the input 131 of the feedforward amplifier stage 130 and is configured to couple or decouple the sensor coil 120 to or from the feedforward amplifier stage 130. In the illustrated differential circuit example, a first switch S3 is coupled between the first terminal 122-1 of coil 120 and the inverting input 131-1 of operational amplifier 134. In the illustrated differential circuit example, a second switch S3 is coupled between the second terminal 122-2 of coil 120 and the non-inverting input 131-2 of operational amplifier 134. Each of the switches S3 may have a low-ohmic parasitic resistance $R_{S3}$ ($R_{S3} << R_{coil}$)

The switching circuit 210 is configured to, during the first operational mode (normal operation), close switches S3 and open switches S1 and S2. Thus, by closing switch(es) S3, coil 120 is coupled to the input 131 of the feedforward amplifier stage 130. By opening switch(es) S1, DC voltage source 220 is decoupled from the input 131 of the feedforward amplifier stage 130. By opening switch(es) S2, the RC lowpass filter 132 is coupled between the output 133 and the input 131 of operational amplifier 134 and feedback resistor R1$_{cal}$ is decoupled from the input 131 of operational amplifier 134.

The switching circuit 210 is configured to, during the second operational mode (startup/calibration mode), open switches S3 and close switches S1 and S2. By opening switch(es) S3, coil 120 is decoupled from the input 131 of the feedforward amplifier stage 130. By closing switch(es) S1, DC voltage source 220 is coupled to the input 131 of the feedforward amplifier stage 130. By closing switch(es) S2, the RC lowpass filter 132 is decoupled from the input 131 of operational amplifier 134 and instead feedback resistor R1$_{cal}$ is coupled between output 133 and input 131 of operational amplifier 134. With a high-ohmic R1$_{cal}$ and low-ohmic parasitic resistance $R_{S1}$ of switch(es) S1, the gain of the feedforward amplifier stage 130 may be increased during the second operational mode (auto-calibration) compared to the first operational mode.

The proposed arrangement to separate feedforward amplifier offset from useful signal comprises a double pair of switches, S1 and S2, a pair of replica Resistors R1$_{cal}$ and a pair of S3 switches. The skilled person having benefit from the present disclosure will appreciate that also other circuit arrangements may be possible to achieve the same or a similar result. For example, also adjustments to the feedback amplifier stage 140 could be made.

When the fast DC offset compensation is set, e.g., during the second operational mode (auto-calibration), S1 and S2 are closed whereas S3 is open. In this phase, the useful signal from sensor coil 120 is discarded and only the DC offset is processed by the servo loop 130, 140. The total amplified offset at output results as:

$$V_{offset,out} = V_{offset,in1} * \left(1 + \frac{R_{1\_cal}}{R_{S_1}}\right) \tag{1}$$

The feedforward amplifier 130 is in the illustrative example of FIG. 2 built with a double input $gm = \Delta I_{out}/\Delta V_{in}$ (transconductance) stage 134 and the total DC offset input referred at the second (here: upper) input is:

$$V_{offset,in2} = V_{offset,in1}\left(\frac{gm1}{gm2}\right), \text{ where } gm2 \ll gm1 \tag{2}$$

The servo-loop transfer function, sensing the DC offset at the output of the feedforward amplifier 130 and feeding it back at a second (here: upper) input of the feedforward amplifier 130 is:

$$V_{offset,in2} = V_{offset,out}\left(\frac{1}{2\pi f R_{DSL_1} C_{DSL}}\right) * \frac{1}{2A} \tag{3}$$

During the second operational mode (auto-calibration), the open-loop offset transfer function obtained by opening the DC servo-loop can be calculated from equations (1), (2) and (3):

$$H_{autocal}(f) = \left(1 + \frac{R_{1\_cal}}{R_{S1}}\right)\left(\frac{gm2}{gm1}\right)\left(\frac{1}{2\pi f R_{DSL_1} C_{DSL}}\right) * \frac{1}{2A}$$

In a similar way, the open-loop offset transfer function can be calculated, when the system goes in the first operational mode (normal operational mode). In this case, DC offset and useful signal are processed, once S3 is closed and S1, S2 are open. The total system now evolves from the DC offset integrated during the second operational mode (auto-calibration phase) and present at the second feedforward amplifier input. The system now rejects the residual DC offset much slower and the speed can be evaluated combining equations (0), (2) and (3):

$$H_{norm}(f) = \left(1 + \frac{R_1}{R_{coil}}\right)\left(\frac{gm2}{gm1}\right)\left(\frac{1}{2\pi f R_{DSL_1} C_{DSL}}\right) * \frac{1}{2A}$$

The significant increase of speed of the servo-loop 130, 140 during auto-calibration is determined by comparing $f_{0dB}$ of H(s) during auto-calibration and during normal application mode.

The acceleration factor is given by:

$$\frac{\left(1 + \frac{R_{1\_cal}}{R_{S1}}\right)}{\left(1 + \frac{R_1}{R_{coil}}\right)}$$

The more R1$_{cal}$ is high ohmic and the parasitic impedance of the S1 switch(es) is low ohmic in comparison respectively to $R_1$ and $R_{coil}$ the faster will be the offset cancellation during auto-calibration. That is, the degree of freedom to speed up the auto-calibration phase in order to remove as much offset as possible before the residual offset error is removed with a much slower speed in normal operation.

It may be observed that the way the useful coil signal is discarded during auto-calibration does not affect at all the signal transfer function since the switches S1, S2 are never in series to $R_1$ or $R_{coil}$ and the only switch(es) S3, closed during normal operation, they connect high ohmic nodes (no current flow).

Figure 3:
FIG. 3 shows a flowchart of a method for operating a coil sensor arrangement in accordance with implementations of the present disclosure.
Figure 3:
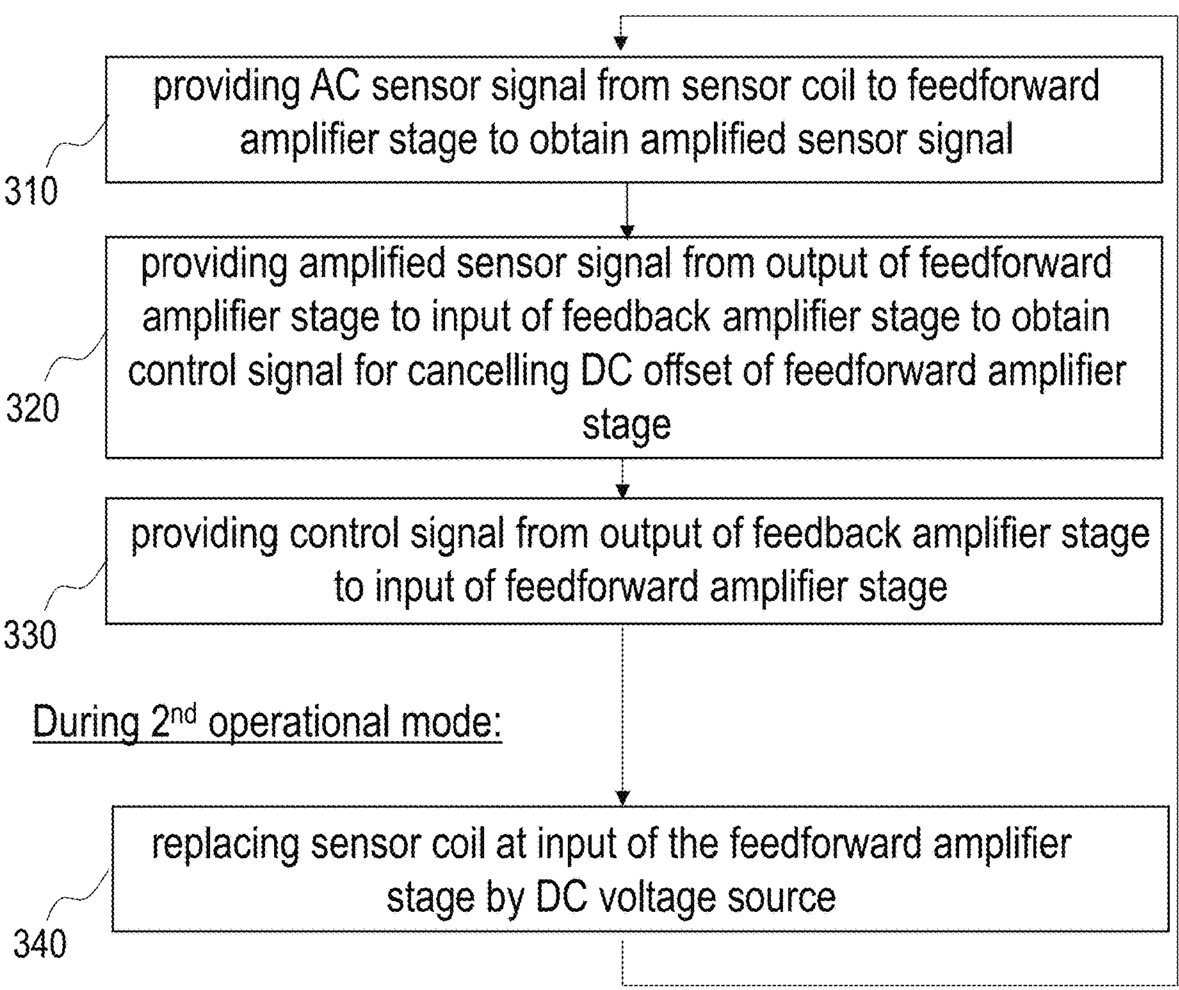

FIG. 3 shows a flowchart of a method 300 for operating the coil sensor circuit 200.

The example method 300 of FIG. 3 includes:

During a first operational mode of the coil sensor circuit:

providing 310 an AC sensor signal from the sensor coil 120 to the feedforward amplifier stage 130 of the coil sensor circuit 200 to obtain an amplified sensor signal, providing 320 the amplified sensor signal from an output of the feedforward amplifier stage 130 to an input of the feedback amplifier stage 140 of the coil sensor circuit 200 to obtain control signal for cancelling the DC offset of the feedforward amplifier stage 130, providing 330 the control signal from an output of the feedback amplifier stage 140 to an input of the feedforward amplifier stage 130.

During a second operational mode of the coil sensor circuit, increasing the gain of the coil sensor circuit 200 with respect to the first operational mode by:

replacing 340 the sensor coil 120 at the input of the feedforward amplifier stage 130 by a (common mode) DC voltage source 220.

Further, method 300 may additionally include replacing 350 the RC lowpass filter 132 between the input 131 and the output 133 of the feedforward amplifier stage 130 by feedback resistor $R1_{cal}$.

Users may experience a fast startup (for coil or hybrid sensors) independently from input frequency speed, e.g., startup-time of DC-DC converters or current measurement.

The aspects and features described in relation to a particular one of the previous examples may also be combined with one or more of the further examples to replace an identical or similar feature of that further example or to additionally introduce the features into the further example.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

Aspects

The following provides an overview of some Aspects of the present disclosure:

Aspect 1: A coil sensor circuit, comprising: a sensor coil configured to provide an alternating current (AC) sensor signal; a feedforward amplifier stage configured to amplify the AC sensor signal to obtain an amplified sensor signal; a feedback amplifier stage coupled between an output and an input of the feedforward amplifier stage and configured to provide a control signal for cancelling a direct current (DC) offset of the feedforward amplifier stage; and a switching circuit configured to: during a first operational mode of the coil sensor circuit: couple the sensor coil to the input of the feedforward amplifier stage, and during a second operational mode of the coil sensor circuit: decouple the sensor coil from the feedforward amplifier stage, and increase a gain of the coil sensor circuit with respect to the first operational mode.

Aspect 2: The coil sensor circuit of Aspect 1, wherein the switching circuit is configured to increase a gain of the feedforward amplifier stage during the second operational mode.

Aspect 3: The coil sensor circuit of Aspect 2, wherein the switching circuit is configured to increase the gain of the feedforward amplifier stage during the second operational mode by switching between a first circuit configuration and a second circuit configuration between the output and the input of the feedforward amplifier stage.

Aspect 4: The coil sensor circuit of any of Aspects 1-3, wherein the switching circuit is configured to: during the first operational mode, couple a resistor-capacitor (RC) lowpass filter between the input and the output of the feedforward amplifier stage, and during the second operational mode, replace the RC lowpass filter by a feedback resistor.

Aspect 5: The coil sensor circuit of Aspect 4, wherein the switching circuit is configured to: during the first operational mode, decouple the feedback resistor from the input of the feedforward amplifier stage, and during the second operational mode, decouple the RC lowpass filter from the input of the feedforward amplifier stage.

Aspect 6: The coil sensor circuit of any of Aspects 1-5, wherein the switching circuit comprises: a first switch coupled between the sensor coil and the input of the feedforward amplifier stage; a second switch coupled between the output and the input of the feedforward amplifier stage; and a third switch coupled between a DC voltage source and the input of the feedforward amplifier stage.

Aspect 7: The coil sensor circuit of Aspect 6, wherein the switching circuit is configured to: during the first operational mode, close the first switch, open the second switch, and open the third switch, and during the second operational mode, close the second switch, close the third switch, and open the first switch.

Aspect 8: The coil sensor circuit of any of Aspects 1-7, wherein the switching circuit is configured to: during the second operational mode, replace the sensor coil by a DC voltage source at the input of the feedforward amplifier stage, and during the first operational mode, replace the DC voltage source by the sensor coil at the input of the feedforward amplifier stage.

Aspect 9: The coil sensor circuit of Aspect 6, wherein a DC voltage of the DC voltage source corresponds to a common mode voltage of the sensor coil in the first operational mode.

Aspect 10: The coil sensor circuit of any of Aspects 1-9, wherein the feedback amplifier stage is configured as an integrator.

Aspect 11: The coil sensor circuit of Aspect 10, wherein a capacitor is coupled between an output and an input of the feedback amplifier stage.

Aspect 12: The coil sensor circuit of any of Aspects 1-11, wherein at least one resistor is coupled between an output of the feedback amplifier stage and the input of feedforward amplifier stage.

Aspect 13: The coil sensor circuit of any of Aspects 1-12, wherein at least one resistor is coupled between the output of the feedforward amplifier stage and an input of the feedback amplifier stage.

Aspect 14: The coil sensor circuit of any of Aspects 1-13, wherein the feedforward amplifier stage and the feedback amplifier stage are configured as differential amplifier stages.

Aspect 15: A method for operating a coil sensor circuit, the method comprising: during a first operational mode of the coil sensor circuit, providing an alternating current (AC) sensor signal from a sensor coil to a feedforward amplifier stage of the coil sensor circuit to obtain an amplified sensor signal; providing the amplified sensor signal from an output of the feedforward amplifier stage to an input of a feedback amplifier stage of the coil sensor circuit to obtain control signal for cancelling a direct current (DC) offset of the feedforward amplifier stage; and providing the control signal from an output of the feedback amplifier stage to an input of the feedforward amplifier stage; and during a second operational mode of the coil sensor circuit, replacing the sensor coil at the input of the feedforward amplifier stage by a DC voltage source.

Aspect 16: The method of Aspect 15, further comprising, during the second operational mode, replacing a resistor-capacitor (RC) lowpass filter between the input and the output of the feedforward amplifier stage by a feedback resistor.

Aspect 17: A system configured to perform one or more operations recited in one or more of Aspects 1-16.

Aspect 18: An apparatus comprising means for performing one or more operations recited in one or more of Aspects 1-16.

The invention claimed is:

1. A coil sensor circuit, comprising:

a sensor coil configured to provide an alternating current (AC) sensor signal;

a feedforward amplifier stage configured to amplify the AC sensor signal to obtain an amplified sensor signal;

a feedback amplifier stage coupled between an output and an input of the feedforward amplifier stage and configured to provide a control signal for cancelling a direct current (DC) offset of the feedforward amplifier stage; and a switching circuit configured to:

during a first operational mode of the coil sensor circuit:

couple the sensor coil to the input of the feedforward amplifier stage, and during a second operational mode of the coil sensor circuit:

decouple the sensor coil from the feedforward amplifier stage, and increase a gain of the coil sensor circuit with respect to the first operational mode.

2. The coil sensor circuit of claim 1, wherein the switching circuit is configured to increase a gain of the feedforward amplifier stage during the second operational mode.

3. The coil sensor circuit of claim 2, wherein the switching circuit is configured to increase the gain of the feedforward amplifier stage during the second operational mode by switching between a first circuit configuration and a second circuit configuration between the output and the input of the feedforward amplifier stage.

4. The coil sensor circuit of claim 1, wherein the switching circuit is configured to:

during the first operational mode, couple a resistor-capacitor (RC) lowpass filter between the input and the output of the feedforward amplifier stage, and during the second operational mode, replace the RC lowpass filter by a feedback resistor.

5. The coil sensor circuit of claim 4, wherein the switching circuit is configured to:

during the first operational mode, decouple the feedback resistor from the input of the feedforward amplifier stage, and during the second operational mode, decouple the RC lowpass filter from the input of the feedforward amplifier stage.

6. The coil sensor circuit of claim 1, wherein the switching circuit comprises:

a first switch coupled between the sensor coil and the input of the feedforward amplifier stage;

a second switch coupled between the output and the input of the feedforward amplifier stage; and a third switch coupled between a DC voltage source and the input of the feedforward amplifier stage.

7. The coil sensor circuit of claim 6, wherein the switching circuit is configured to:

during the first operational mode, close the first switch, open the second switch, and open the third switch, and during the second operational mode, close the second switch, close the third switch, and open the first switch.

8. The coil sensor circuit of claim 1, wherein the switching circuit is configured to:

during the second operational mode, replace the sensor coil by a DC voltage source at the input of the feedforward amplifier stage, and during the first operational mode, replace the DC voltage source by the sensor coil at the input of the feedforward amplifier stage.

9. The coil sensor circuit of claim 6, wherein a DC voltage of the DC voltage source corresponds to a common mode voltage of the sensor coil in the first operational mode.

10. The coil sensor circuit of claim 1, wherein the feedback amplifier stage is configured as an integrator.

11. The coil sensor circuit of claim 10, wherein a capacitor is coupled between an output and an input of the feedback amplifier stage.

12. The coil sensor circuit of claim 1, wherein at least one resistor is coupled between an output of the feedback amplifier stage and the input of feedforward amplifier stage.

13. The coil sensor circuit of claim 1, wherein at least one resistor is coupled between the output of the feedforward amplifier stage and an input of the feedback amplifier stage.

14. The coil sensor circuit of claim 1, wherein the feedforward amplifier stage and the feedback amplifier stage are configured as differential amplifier stages.

15. A method for operating a coil sensor circuit, the method comprising:

during a first operational mode of the coil sensor circuit, providing an alternating current (AC) sensor signal from a sensor coil to a feedforward amplifier stage of the coil sensor circuit to obtain an amplified sensor signal;

providing the amplified sensor signal from an output of the feedforward amplifier stage to an input of a feedback amplifier stage of the coil sensor circuit to obtain control signal for cancelling a direct current (DC) offset of the feedforward amplifier stage; and providing the control signal from an output of the feedback amplifier stage to an input of the feedforward amplifier stage; and during a second operational mode of the coil sensor circuit, replacing the sensor coil at the input of the feedforward amplifier stage by a DC voltage source.

16. The method of claim 15, further comprising, during the second operational mode, replacing a resistor-capacitor (RC) lowpass filter between the input and the output of the feedforward amplifier stage by a feedback resistor.

* * * * *